(12) United States Patent
Kahng et al.

(10) Patent No.: US 8,402,396 B2
(45) Date of Patent: Mar. 19, 2013

(54) LAYOUT DECOMPOSITION FOR DOUBLE PATTERNING LITHOGRAPHY

(75) Inventors: Andrew B. Kahng, Del Mar, CA (US); Hailong Yao, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 150 days.

(21) Appl. No.: 12/892,371

(22) Filed: Sep. 28, 2010

(65) Prior Publication Data

US 2011/0078638 A1    Mar. 31, 2011

Related U.S. Application Data

(60) Provisional application No. 61/246,613, filed on Sep. 29, 2009.

(51) Int. Cl.
G06F 17/50 (2006.01)
(52) U.S. Cl. .............................. 716/52; 716/54; 716/110
(58) Field of Classification Search ...................... 716/52
See application file for complete search history.

(56) References Cited

U.S. PATENT DOCUMENTS

| | | | |
|---|---|---|---|
| 7,614,032 B2 | 11/2009 | Kahng et al. | |
| 8,209,656 B1 * | 6/2012 | Wang et al. | 716/139 |
| 2008/0307381 A1 * | 12/2008 | Tritchkov et al. | 716/11 |
| 2010/0229145 A1 * | 9/2010 | Sahouria et al. | 716/19 |

OTHER PUBLICATIONS

Caldwell, Andrew, et. al., "Improved Algorithms for Hypergraph Bipartitioning", *Proceedings of the 2000 conference on Asia South Pacific design automation ASPDAC*, (2000).
Cao, Y. et. al., "Design Sensitivities to Variability: Extrapolations and Assessment in Nanometer VLSI", *ASIC/SOC Conference, 2002. 15th Annual IEEE International*, Sep. 25-28, 2002.
Chiang, C. et. al.,"Fast and Efficient Phase Conflict Detection and Correction in Standard-Cell Layouts", *Proc. IEEE Intl. Conf. on Computer-Aided Design*, 2005, pp. 149-156.
Chuang, Weitong, et. al., "Delay and Area Optimization for Discrete Gate Sizes Under Double-Sided Timing Constraints", *IEEE 1993 Custom Integrated Circuits Conference*, 1993.
Drapeau, M., et. al., "Double Patterning Design Split Implementation and Validation for the 32nm Node", *Proc. SPIE Conf. on Design for Manufacturability Through Design-Process Integration*, Feb. 28, 2007, 652109-1-852109-15.
Dunlop, Alfred, E., et. al., "Experiments Using Automatic Physical Design Techniques for Optimizing Circuit Performance", *1990 IEEE International Symposium on Circuits and Systems*, 1990.
Dusa, M., et al., "Pitch Doubling Through Dual-Patterning Lithography Challenges in Integration and Litho Budgets", *Proc. SPIE Conf. on Optical Microlithography*, 2007, pp. 65200G-1-65200G-10.

(Continued)

*Primary Examiner* — Paul Dinh
*Assistant Examiner* — Bryce Aisaka
(74) *Attorney, Agent, or Firm* — Greer, Burns & Crain Ltd.

(57) ABSTRACT

The invention provides systems and methods for layout decomposition to produce exposure layouts that can be used to perform double patterning lithography (DPL). Preferred embodiment methods of the invention are executed by a computer and provide alternate methods for layout decomposition for double patterning lithography (DPL) using integer linear programming (ILP) formulations. Embodiments of the invention meet a key optimization goals, which is to reduce the total cost of layout decomposition, considering the abovementioned aspects that contribute to cost of prior conventional DPL techniques. Embodiments of the invention provide integer linear programming (ILP), phase conflict detection (PCD) and node election bipartization (NBD) formulations for the optimization of DPL layout decomposition, with a process-aware cost function that avoids small jogging line-ends, and maximizes overlap at dividing points of polygons. The cost function can also make preferential splits at landing pads, junctions and long runs.

24 Claims, 13 Drawing Sheets

OTHER PUBLICATIONS

Finders, J., et. al., "Double Patterning Lithography: The Bridge Between Low k1 ArF and EUV", *Microlithography World*, Feb. 2008.

Kahng, Andrew B., et. al., "New Graph Bipartizations for Double-Exposure. Bright Field Alternating Phase-Shift Mask Layout", *ASP-DAC '01 Proceedings of the 2001 Asia and South Pacific Design Automation Conference*, 2001.

Kahng, Andrew B., et. al., "Revisiting the Layout Decomposition Problem for Double Patterning Lithography", *Proc. BACUS Symposium on Photomask Technology and Management*, 2008, pp. 71220N-1-71220N-12.

Kahng, Andrew B., et. al., "Layout Decomposition for Double Patterning Lithography", *Proc. IEEE/ACM International Conference on Computer Aided Design*, Nov. 10-13, 2008, pp. 465-472.

Kahng, Andrew B., et. al., "Yield- and Cost-Driven Fracturing for Variable Shaped-Beam Mask Writing", *24th Annual BACUS Symposium on Photomask Technology*, Dec. 6, 2004.

Maenhoudt, M., et.al., "Double Patterning Scheme for Sub-0.25 k1 Single Damascene Structures at NA=0.75, $\lambda$=193nm", *Proc. SPIE Conf. on Optical* Microlithography, 2005, pp. 1508-1518.

Nair, Ravi, et al., "Generation of Performance Constraints for Layout", *IEEE Transactions on Computer-Aided Design*, vol. 8, No. 8, Aug. 1989.

Rieger, Michael L., et. al., "Layout Design Methodologies for Sub-Wavelength Manufacturing", *Design Automation Conference, 2001. Proceedings*, 2001.

Sreedhar, Aswin, et. al., "Statistical Yield Modeling for Sub-wavelength Lithogrpahy", *International Test Conference, IEEE 2008*.

\* cited by examiner

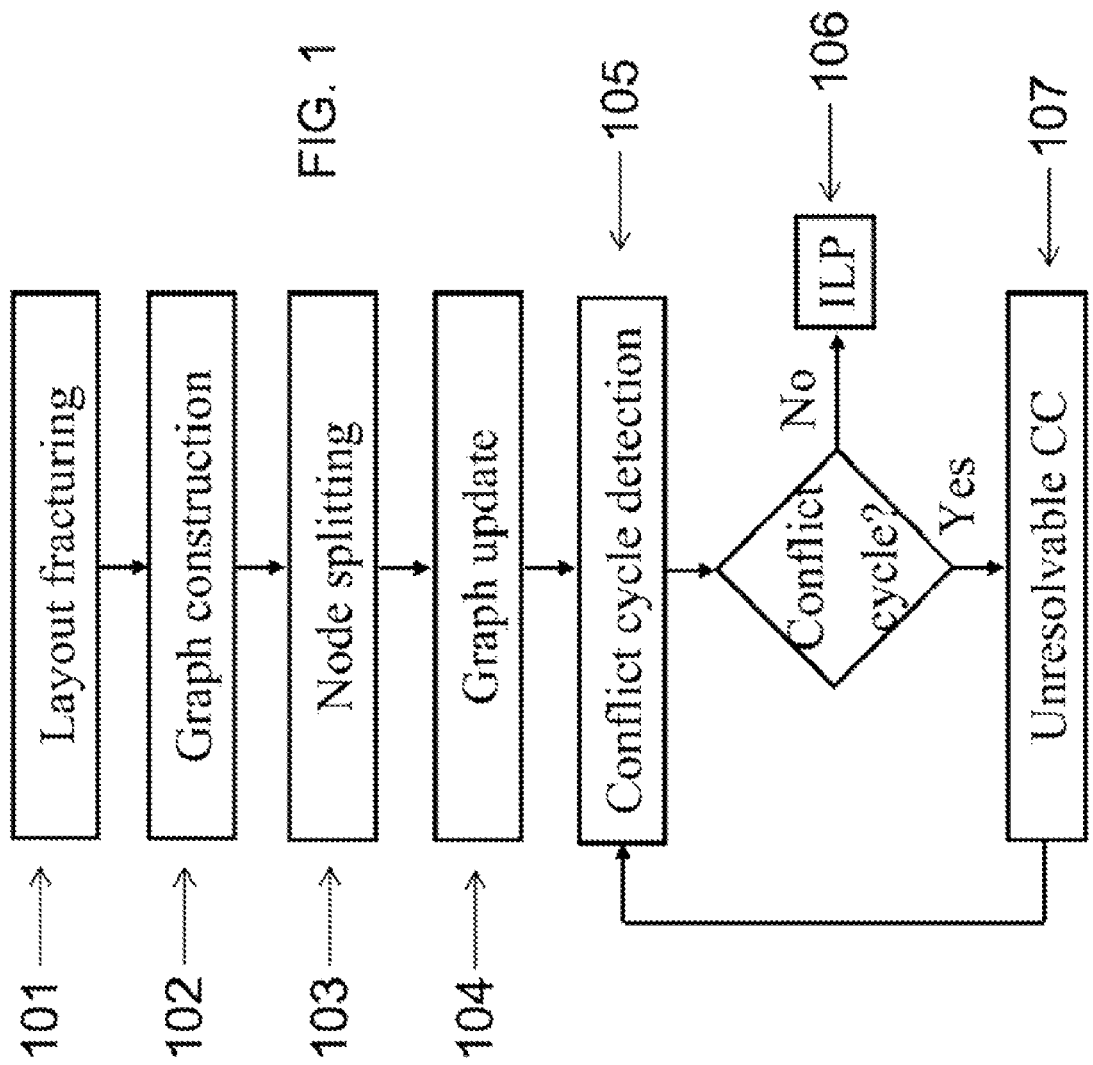

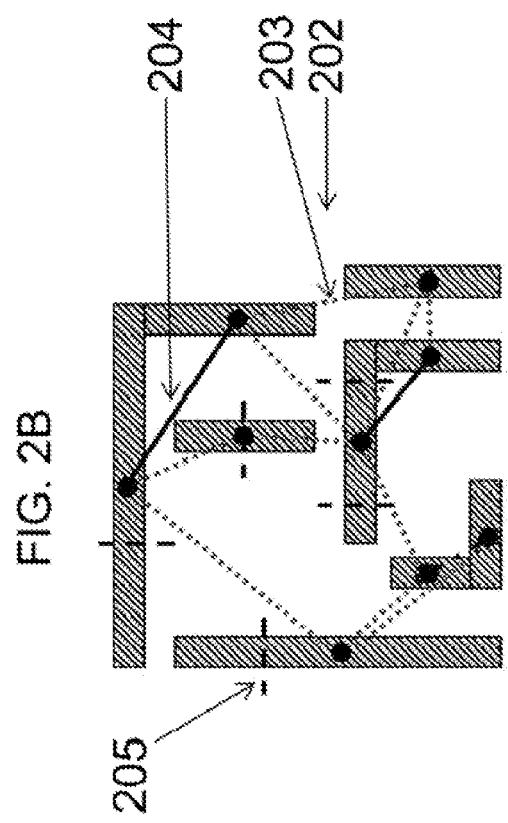
FIG. 2A
FIG. 2B
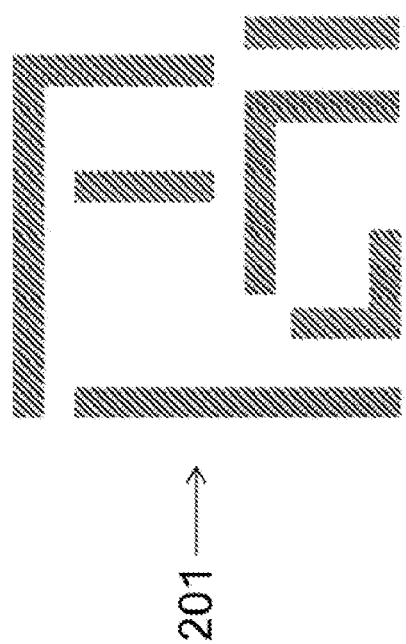
FIG. 2C
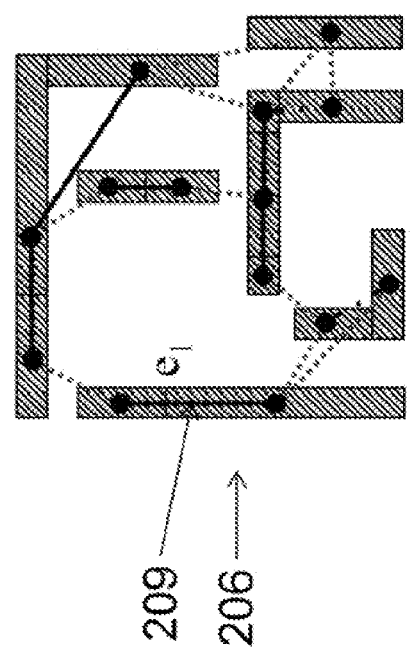
FIG. 2D

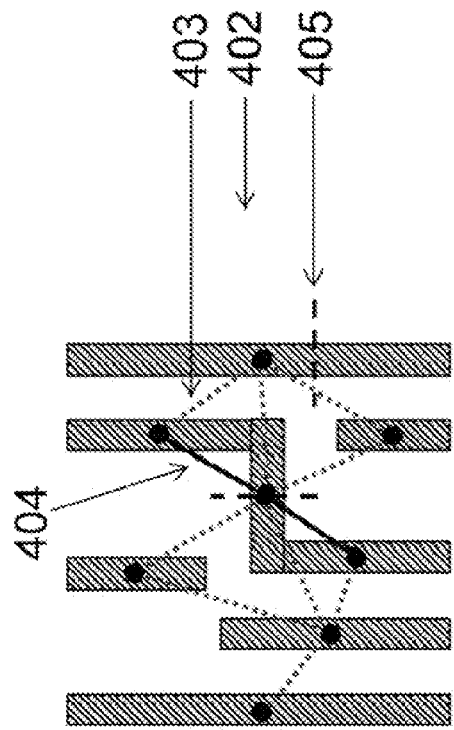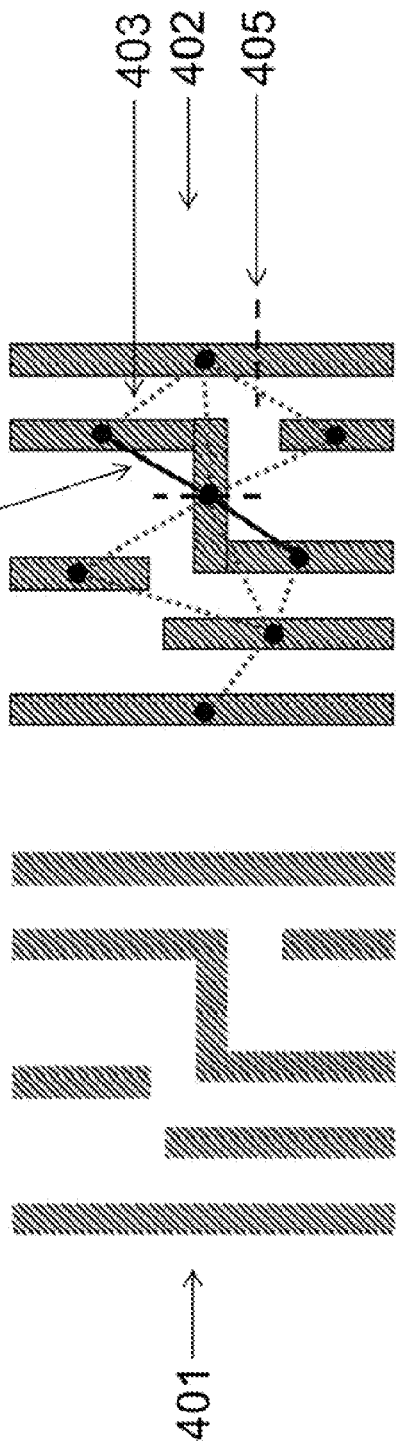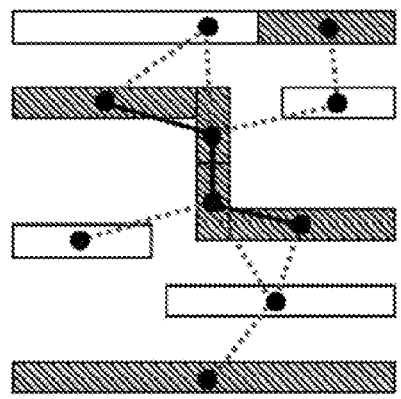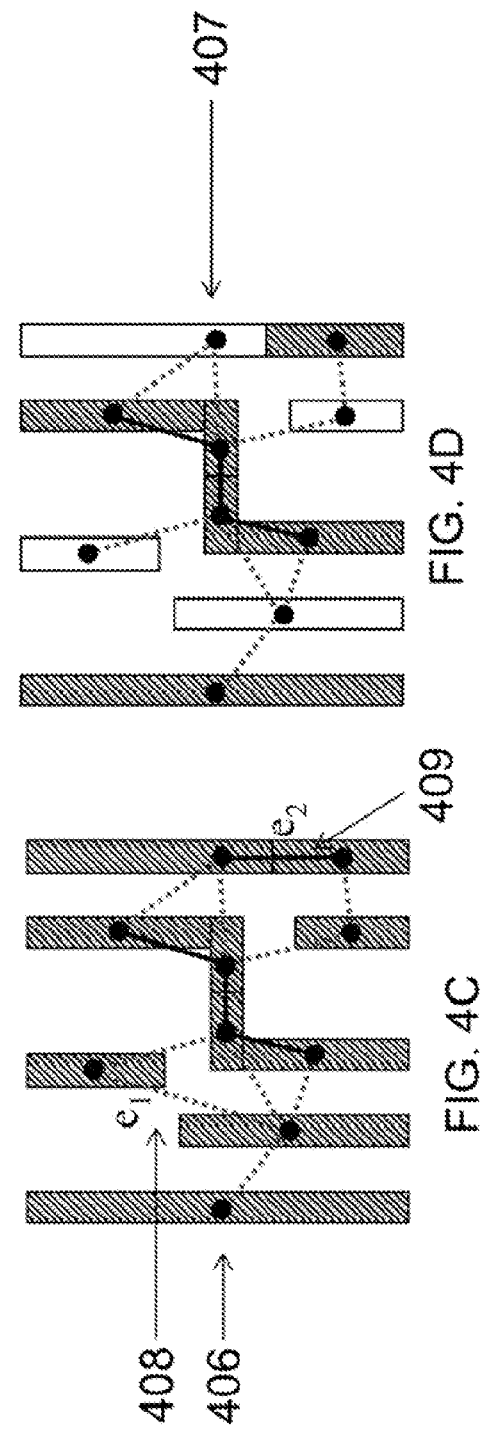

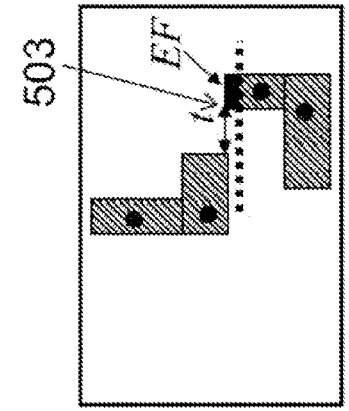 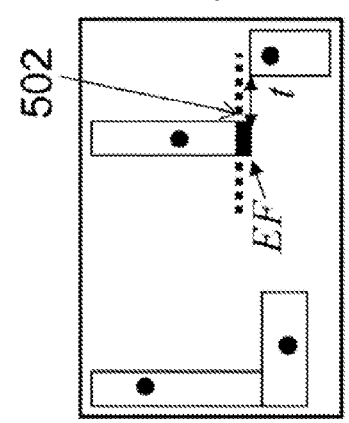 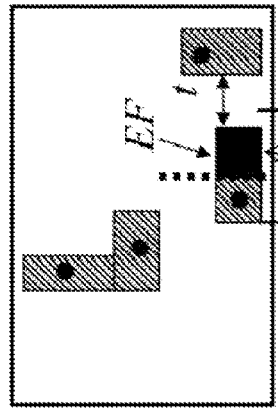
FIG. 5A  FIG. 5B  FIG. 5C
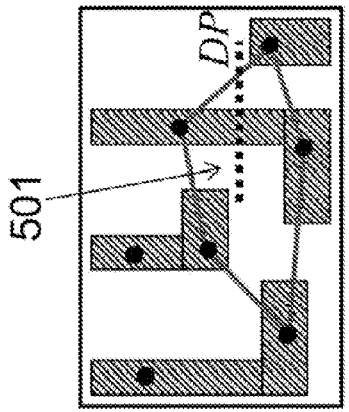 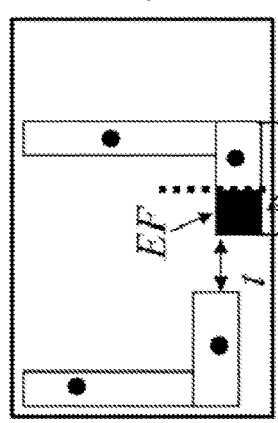 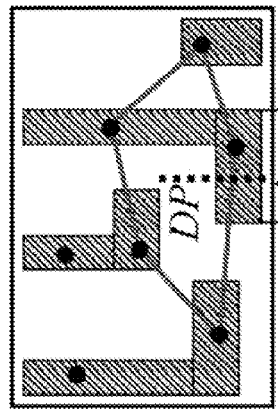
FIG. 5D  FIG. 5E  FIG. 5F

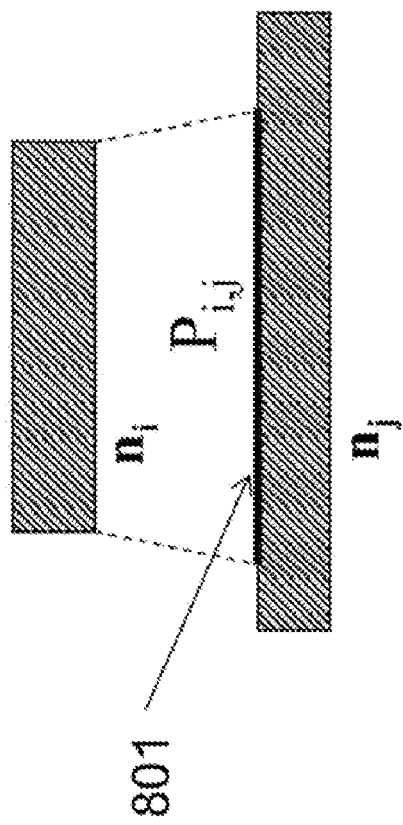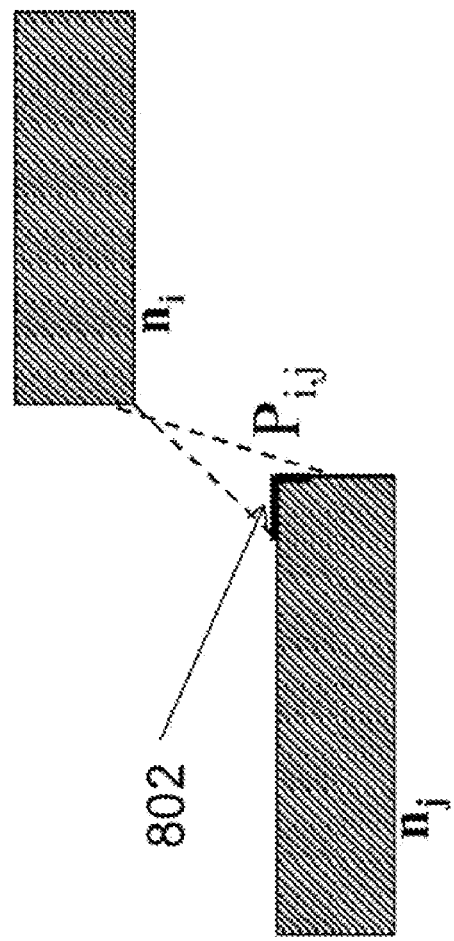

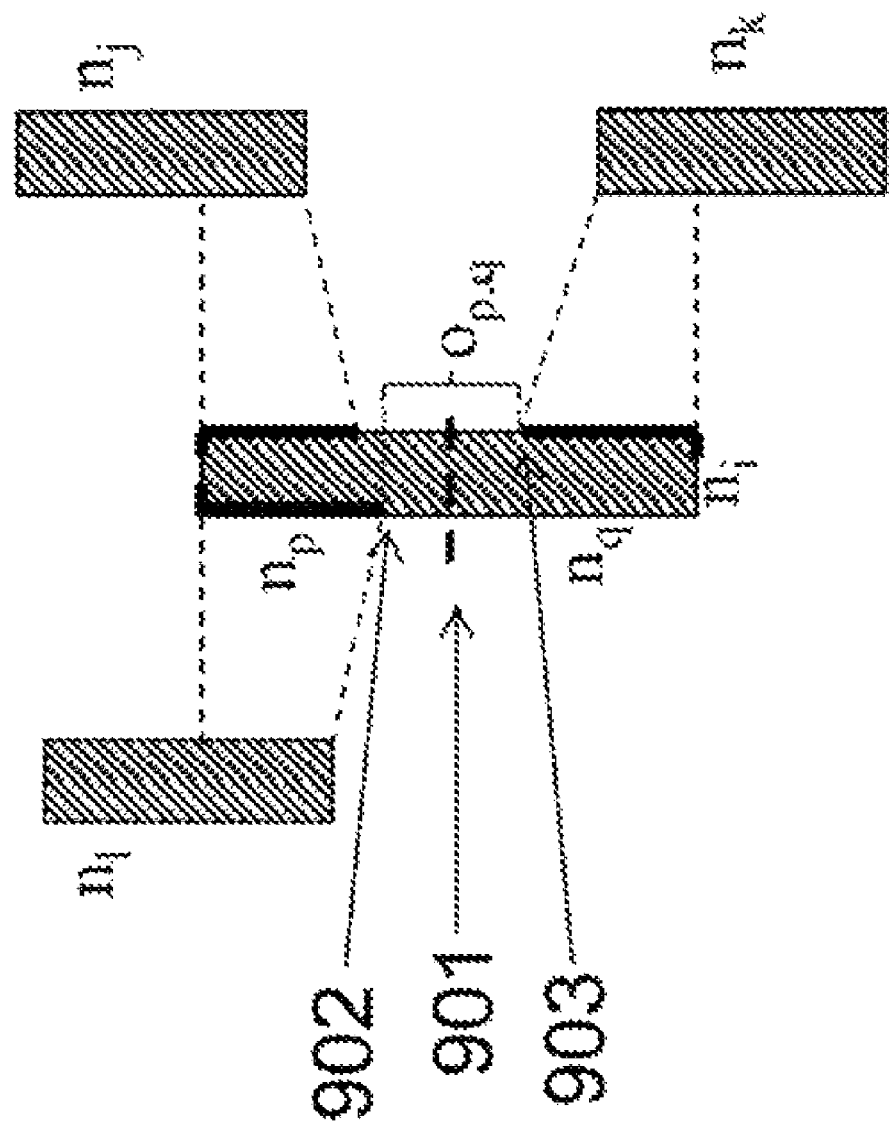

Algorithm 1 Conflict cycle detection algorithm.

Input: Conflict graph $G$, starting node $n_0$ and *flag* for cycle reporting.
Output: Report one conflict cycle if there exist any conflict cycles.

1. Set distance $d_i \leftarrow -\infty$ for each node $n_i \in G$;
2. Make a queue $Q$ and enqueue node $n_0 \in G$ into $Q$;
3. Set distance $d_0 \leftarrow 0$ for $n_0$;
4. while $Q$ is not empty do
5.    Dequeue the first node $n_j$ in $Q$;
6.    for all nodes $n_k$ adjacent to $n_j$ do
7.       if $d_k \geq 0$ then
8.          if $d_k = d_j$ then
9.             if $flag = true$ then
10.                Call Algorithm 2 to report a conflict cycle;
11.                return;
12.             else
13.                Call Algorithm 1 on the BFS-induced graph of $n_0$ with starting node $n_j$ and $flag = true$;
14.                return;
15.             end if
16.          end if
17.       else
18.          Set $d_k \leftarrow d_j + 1$;
19.          Enqueue $n_k$ into $Q$;
20.       end if
21.    end for
22. end while

FIG. 10

Algorithm 2 Conflict cycle reporting algorithm.

Input: Conflict graph $G$ with marked distances and nodes $n_j$ and $n_k$ in the detected conflict cycle in Algorithm 1.

Output: Report the nodes in the detected conflict cycle in a doubly-linked list, where edges of the cycle are between adjacent nodes in the list.

1. Make a map $F$ to store the parent node for each node;
2. Set $F(n_j) \leftarrow$ NULL, $F(n_k) \leftarrow$ NULL.
3. Make a queue $Q$ and enqueue nodes $n_j$ and $n_k$ into $Q$;
4. while $Q$ is not empty do
5.    Dequeue the first node $n_x$ in $Q$;
6.    for all nodes $n_y$ adjacent to $n_x$ do
7.      if $d_{n_x}+1 = d_{n_y}$ then
8.        if $n_x$ is visited then
9.          Make a doubly-linked list $L$;
10.          Push $n_x$ into $L$;
11.          Push $n_y$ to the back of $L$;
12.          Set $n_j \leftarrow F(n_y)$;
13.          while $n_j \neq$ NULL do
14.            Push $n_j$ to the back of $L$;
15.            Set $n_j \leftarrow F(n_j)$;
16.          end while
17.          Set $n_j \leftarrow F(n_x)$;
18.          while $n_j \neq$ NULL do
19.            Push $n_j$ to the front of $L$;
20.            Set $n_j \leftarrow F(n_j)$;
21.          end while
22.          return $L$;
23.        end if
24.        Set $F(n_y) \leftarrow n_x$;
25.        Mark $n_x$ as visited;
26.        Enqueue $n_y$ into $Q$;
27.        break;
28.      end if
29.    end for
30. end while

Algorithm 3 Layout partitioning algorithm.

Input: Conflict graph $G$ and the mapping information from nodes to polygons.
Output: A set of clusters of nodes such that no edge or node pair from any single layout polygon exists in between any pair of clusters.

1. Make a new graph $G'$ on polygons with each node $u'$ representing a polygon;
2. for all $e = (u, v) \in G$ do
3.    Set edge $e' \leftarrow (u', v') \in G'$, where $u'$ and $v'$ correspond to the polygons in which rectangles of $u$ and $v$ are respectively located;
4. end for
5. while there is an unvisited node $n'_i \in G'$ do
6.    Make a new cluster $c'_j$ containing $n'_i$;
7.    Perform breadth-first search from $n'_i$ and add all visited nodes into $c'_j$;
8. end while
9. for all clusters $c'_j$ do
10.    Make cluster $c_j$ on the nodes of the polygons in $c'_j$;
11. end for

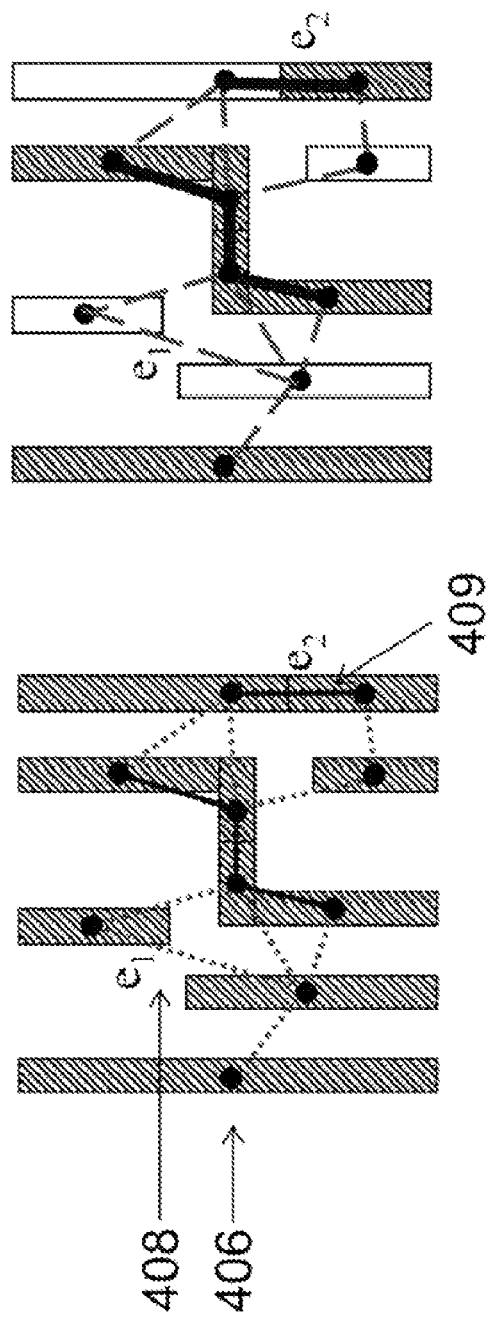
FIG. 13A
FIG. 13B
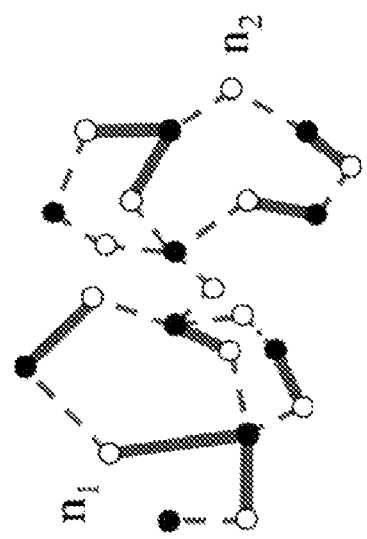
FIG. 13C

LAYOUT DECOMPOSITION FOR DOUBLE PATTERNING LITHOGRAPHY

PRIORITY CLAIM AND REFERENCE TO RELATED APPLICATION

The application claims priority under 35 U.S.C. §119 from prior provisional application Ser. No. 61/246,613, which was filed on Sep. 29, 2009.

FIELD

Fields of the invention include integrated circuits and integrated circuit fabrication.

BACKGROUND

Lithography is an optical patterning process that patterns a material, e.g., photoresist, which is then developed to define a mask for integrated circuit fabrication processes. Reducing feature sizes to be smaller than the wavelength of light used to form the pattern in photoresist is referred to as sub-wavelength lithography. Sub-wavelength lithography presents many challenges to manufacturers trying to maintain the economic scaling of semiconductors postulated by Moore's Law. Double patterning lithography techniques are sub-wavelength techniques that are used to achieve sub 45 nm nodes with presently available manufacturing equipment. A standard single photoresist pattern begins to blur at about 45 nm feature size. With double patterning lithography methods, coarse patterns can be used to define patterns that exceed the resolution limit of the optical lithography tool used to pattern the material being patterned and developed as a mask.

As Moore's law continues to drive performance and integration with smaller circuit features, lithography is pushed to new extremes. For 32 nm node patterning, prospects for new lithography techniques such as extreme ultraviolet (EUV) and immersion ArF (IArF) are unclear. An EUV imaging system is composed of mirrors coated with multilayer structures designed to have high reflectivity at a 13.5 nm wavelength. There are significant technical hurdles to implementation of EUV lithography in terms of mask-blank fabrication, high output power source, resist material, etc. Challenges to production use of IArF include very high-refractive index fluids (to enable NA=1.55~1.6), and accompanying advances in high-index resists and optical materials.

Conventional immersion lithography is unlikely to take the industry to 32 nm node patterning, while Double Patterning Lithography (DPL) is a primary lithography candidate for that technology node. DPL involves the partitioning of dense circuit patterns into two separate exposures. Decreased pattern density in each exposure improves resolution and depth of focus (DOF). Conventional DPL increases manufacturing cost due to its complex process flows, and overlay control between the two patterning exposures becomes a critical issue.

A concern with conventional DPL is an increased manufacturing cost. Two fundamental factors contribute to DPL cost: (1) complex process flows due to double exposure patterning, and (2) tight overlay control between the two patterning exposures. Prior efforts have sought to address these concerns. Two primary approaches to DPL are the LELE (litho-etch-litho-etch) and self-aligned approaches. The first etch step in LELE is necessary to transfer the pattern of the first resist layer into an underlying hard mask, which is not removed during the second exposure. See, e.g., J. Finders, M. Dusa and S. Hsu, "Double Patterning Lithography: The Bridge Between Low k1 ArF and EUV", Microlithography World, February 2008. Photoresist is re-coated on the surface of the first process for a second exposure. The second mask, having patterns separated from the first mask. The process completes with the hard mask and resist of second exposure.

In self-aligned DPL and other DPL approaches that incorporate two lithographic exposures with only one etch step, the image formed by the first exposure may interact with the image formed by the second exposure. In self-aligned DPL patterns for the first layer are transferred into the hard mask and then nitride spacers are formed on the sidewalls of the patterns. See, e.g., M. Maenhoudt, J. Versluijs, H. Struyf, J. Van Olmen, and M. Van Hove, "Double Patterning Scheme for Sub-0.25 k1 Single Damascene Structures at NA=0.75, $\lambda$=193 nm", Proc. SPIE Conf. on Optical Microlithography, 2005, pp. 1508-1518. In typical self-aligned DPL, a spacer is formed by deposition or reaction of the film on the pattern, followed by etching to remove all the film material except for the material on the sidewalls. Then, film materials between spacers produce the patterns for the second layer. A major concern of DPL is overlay control, which is leads to requirements for more accurate overlay metrology, more representative sampling, reduced model residuals, and improved overlay correction. See, e.g., M. Dusa et al., "Pitch Doubling Through Dual-Patterning Lithography Challenges in Integration and Litho Budgets", Proc. SPIE Conf. on Optical Microlithography, 2007, pp. 65200G-1-65200G-10.

According to the International Technology Roadmap for Semiconductors, DPL requires overlay control of between 9 nm and 6 nm, which has been a major hurdle for production deployment. A key issue in DPL from the design point of view is the decomposition of the layout for multiple exposures. DPL layout decomposition must satisfy the requirement that two features are assigned opposite colors (corresponding to mask exposures) if their spacing is less than the minimum coloring spacing. Alternate Phase Shift Mask coloring and automatic phase shift conflict detection and resolution methods accomplish layout perturbation, i.e., increasing the spacing between features and increasing the width of critical features, to make the layout-derived graph bipartite. See, A. B. Kahng, S. Vaya and A. Zelikovsky, "New Graph Bipartizations for Double-Exposure, Bright Field Alternating Phase-Shift Mask Layout", Proc. Asia and South Pacific Design Automation Conference, 2001, pp. 133-138; C. Chiang, A. B. Kahng, S. Sinha and X. Xu, "Fast and Efficient Phase Conflict Detection and Correction in Standard-Cell Layouts", Proc. IEEE Intl. Conf. on Computer-Aided Design, 2005, pp. 149-156.

However, layout pattern configurations exist in DPL for which features within this minimum coloring spacing cannot all be assigned different colors. In such cases, at least one feature must be split into two or more parts. The to Alternate Phase Shift Mask coloring and automatic phase shift conflict detection and resolution methods do not utilize or provide for feature splitting. A drawback of conventional DPL pattern splitting is that it increases manufacturing cost and complexity due to (1) generation of excessive line-ends, which causes yield loss due to overlay error in double-exposure, as well as line-end shortening under defocus; and (2) resulting requirements for tight overlay control, possibly beyond currently envisioned capabilities. Other risks include line edge (CD) errors due to overlay error, and interference mismatch between different masks. Therefore, a key optimization goal is to reduce the total cost of layout decomposition, considering the above-mentioned aspects, as well as other concerns such as forbidden-pitch and other design rule restrictions on each mask, as well as layout density balance across masks.

A major concern of DPL is overlay control, which leads to requirements for more accurate overlay metrology, more representative sampling, reduction in model residuals, and improved overlay correction. Another key issue in DPL from the design point of view is the decomposition of the layout for multiple exposure steps. DPL layout decomposition must satisfy the following requirement: two features must be assigned opposite colors (corresponding to mask exposures) if their spacing is less than the minimum coloring spacing. However, there exist pattern configurations for which features within this minimum coloring spacing cannot all be assigned different colors. In such cases, at least one feature must be split into two or more parts. The feature splitting increases manufacturing cost and complexity due to (1) generation of additional line-ends, which cause yield loss due to overlay error in double-exposure, as well as line-end shortening under defocus; and (2) resulting requirements for tight overlay control, possibly beyond currently envisioned capabilities. Other risks include line edge (CD) errors due to overlay error, and interference mismatch between different masks.

SUMMARY OF THE INVENTION

The invention provides systems and methods for layout decomposition to produce exposure layouts that can be used to perform double patterning lithography (DPL). Preferred embodiment methods of the invention are executed by a computer and provide alternate methods for layout decomposition for double patterning lithography (DPL) using coloring solutions that meet key optimization goals, which include reducing the total cost of layout decomposition, considering the abovementioned aspects that contribute to cost of prior conventional DPL techniques. Embodiments of the invention provide integer linear programming (ILP), phase conflict detection (PCD) and node election bipartization (NBD) formulations for optimization of DPL layout decomposition, with a process-aware cost function that avoids small jogging line-ends, and maximizes overlap at dividing points of polygons. The cost function can also make preferential splits at landing pads, junctions and long runs.

BRIEF DESCRIPTION OF THE DRAWINGS

FIG. 1 shows DPL layout decomposition flow using a preferred conflict cycle detection (CCD) approach;

FIGS. 2A-2D illustrated a preferred conflict graph and layout coloring process using a preferred CCD approach;

FIGS. 4A-4D show an example of a preferred conflict graph and layout coloring using a preferred PILP approach;

FIGS. 5A-5F illustrate a preferred layout fracturing process that assigns two example dividing points to fracture a polygonal layout;

FIGS. 8A and 8B illustrate a preferred process for projecting nodes;

FIG. 9 illustrates a preferred rule-based node splitting process;

FIG. 10 shows a preferred conflict cycle detection algorithm (Algorithm 1);

FIG. 11 shows a preferred conflict cycle reporting algorithm (Algorithm 2);

FIG. 12 shows a preferred layout partitioning algorithm (Algorithm 3);

FIGS. 13A-13C show examples of a preferred conflict graph and layout coloring using preferred phase conflict detection (PCD) and node election bipartization (NBD) formulations.

DESCRIPTION OF THE PREFERRED EMBODIMENTS

Figure 3:
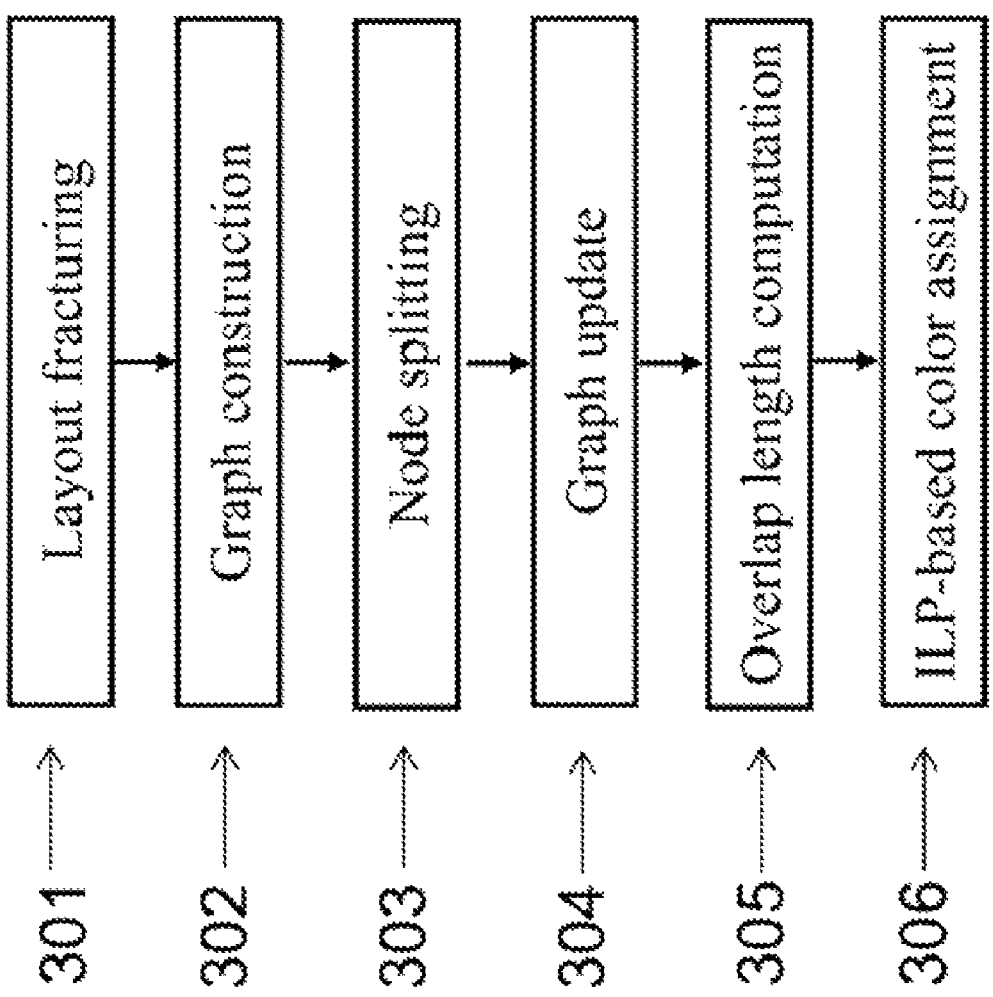
FIG. 3 shows DPL layout decomposition flow using a preferred pure integer language programming (PILP) approach.

The invention provides systems and methods for layout decomposition to produce exposure layouts that can be used to perform double patterning lithography (DPL). Preferred embodiment methods of the invention are executed by a computer and provide alternate methods for layout decomposition for double patterning lithography (DPL) using integer linear programming (ILP), phase conflict detection (PCD) and node election bipartization (NBD) formulations. Embodiments of the invention meet key optimization goals, which include reducing the total cost of layout decomposition, compared to prior conventional DPL techniques.

Embodiments of the invention provide integer linear programming (ILP) formulations, phase conflict detection (PCD) and node election bipartization (NBD) formulations for the optimization of DPL layout decomposition, with a process-aware cost function that avoids small jogging line-ends, and maximizes to overlap at dividing points of polygons. The cost function can also make preferential splits at landing pads, junctions and long runs.

Layout decomposition for DPL is a different problem than Alternate Phase Mask Shifting, because it does not have any concept of width perturbation. DPL also includes feature splitting, which is not relevant to phase shift mask coloring and has no provided solution in Alternate Phase Mask Shifting. At the same time, the present inventors have recognized that layout decomposition for DPL can make use of phase shift mask coloring techniques used in Alternate Phase Mask Shifting since embodiments of the invention can also be formulated as graph bipartizations.

A preferred system of the invention includes a system for layout decomposition that provides a layout to an optical lithography system. The optical lithography system develops layout to pattern material, e.g., photoresist. The system develops the material to provide a mask that is then used to fabricate sub-wavelength integrated circuit features. The system for layout decomposition, as described in the present invention, or any of its components, can be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present invention. The computer system can comprises a computer, an input device, a display unit, and the Internet. The computer comprises a microprocessor, which is connected to a communication bus. The computer also includes a memory, which can include Random Access Memory (RAM) and Read Only Memory (ROM). The computer system further comprises a storage device which can be a hard disk drive or a removable storage drive such as a floppy disk drive, optical disk drive, and so forth. The storage device can also be other similar means of loading computer programs or other instructions into the computer system. The computer system executes a set of instructions that are stored in one or more storage elements, in order to process input data. The storage elements can also hold data or other information, as desired. The storage element can be in the form of an information source or a physical memory element present in the processing machine. Exemplary storage elements include hard disk, DRAM, SRAM and EPROM. The storage element can also be external to the computer system, and connected to or inserted into the computer, for download at or prior to the time of use. Examples of such external computer program products are computer-readable storage media such as CD-ROMS, flash chips, floppy disks, and so forth. The set of instructions can include various commands that instruct the processing machine to perform specific tasks, such as the steps that constitute the method of the present invention. The set of instructions can be in the form of a software program. The software can be in various forms, such as system software or application software. Further, the software might be in the form of a collection of separate programs, a program module with a larger program, or a portion of a program module. The software might also include modular programming in the form of object-oriented programming. The software program containing the set of instructions can be embedded in a computer program product, for use with a computer. The computer program product comprises a computer-usable medium having a computer-readable program code embodied therein. The processing of input data by the processing machine can be in response to user commands or in response to results of previous processing, or in response to a request made by another processing machine.

Preferred embodiments of invention provide important advantages. One advantage is that the conflict cycle detection algorithm in preferred embodiments efficiently finds patterns with color assignments that can't be resolved. Because such patterns cannot be manufactured by DPL despite layout decomposition, this detection step enables fast feedback to a designer to modify the layout pattern. Another advantage of preferred embodiments is that the node splitting method resolves the coloring conflicts considering the pre-specified overlay margin and enlarges the solution space for DPL coloring, from which the optimal coloring solution is obtained using our ILP formulation. An advantage of the ILP-based color assignment algorithms (with both CCD and PILP approaches) is the ability to optimize a weighted combination of the number of line-ends, the overlap lengths in the decomposed layout, and the number of design rule violations. The PILP color assignment also can minimize the number of design changes (e.g., layout modifications) needed to make the conflict graph two-colorable. Another important advantage is that layout partitioning techniques of the invention improve scalability of the ILP-based coloring solution, whose runtime would otherwise increase unmanageably with layout size.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

In the following description a polygon feature is a DPL layout polygon. A rectangular features results from fracturing operations to fracture polygons into rectangles. Polygons or rectangles can be split at dividing points. After DPL color assignment, where there are two touching rectangles with different colors, there is a cut, which corresponds to two line-ends. In a conflict graph, each rectangle after polygon fracturing is represented as a node. Nodes are assigned to rectangular features, so a node splitting operation achieves the splitting of one or more rectangles into smaller ones with each new rectangular feature having a node assigned to it. A cycle in a graph is a path that leads back to the starting node after going through other nodes.

Preferred methods and systems of the invention can use alternate preferred layout decomposition approaches. A first preferred layout decomposition approach (referred to as Conflict Cycle Detection or CCD) performs conflict cycle detection to find and report coloring conflicts (i.e., design changes such as layout modifications are needed) then finds the coloring solution on the remaining features using an ILP formulation. The second approach (referred to as Pure ILP or PILP) directly computes the coloring solution on the rectangles after polygon splitting, along with the minimum number of necessary layout modifications, using a more sophisticated ILP formulation. An exemplary objective for the DPL layout decomposition methods is to optimize a weighted combination including number of design changes, number of line-ends, number of design rule violations, and the overlap lengths between touching features with different colors.

Embodiments of the invention provide integer linear programming (ILP), phase conflict detection (PCD) and node election bipartization (NBD) formulations for the optimization of DPL layout decomposition, with a process-aware cost function that avoids small jogging line-ends, and maximizes overlap at dividing points of polygons. The cost function can also be revised to make preferential splits at landing pads, junctions and long runs.

A. Conflict Cycle Detection Approach

FIG. 1 shows the overall flow for a preferred DPL layout decomposition using a conflict cycle detection CCD approach.

Layout fracturing 101. Given a layout, the polygonal layout features are first fractured into a set of non-overlapping rectangles using a minimum-sliver fracturing algorithm. For an example minimum-sliver fracturing algorithm, see, e.g., A. B. Kahng, X. Xu and A. Zelikovsky, "Fast Yield-Driven Fracture for Variable Shaped-Beam Mask Writing", *Proc. SPIE Conf. on Photomask and Next-Generation Lithography Mask Technology,* 2006, pp. 62832R-1-62832R-9. The minimum-sliver fracturing algorithm minimizes the number of slivers and helps simplify downstream operations.

Graph construction 102. A conflict graph is constructed over the to rectangular features according to a predetermined minimum coloring spacing t, where t is determined by limits of the manufacturing process. Each node in the graph represents a rectangular feature. There are two types of edges in the graph: touching edges and conflict edges. A touching edge exists between two nodes if the corresponding features touch each other, and a conflict edge exists between two nodes if the corresponding features do not touch each other, but are separated by a distance less than t. When a conflict graph is two-colored, a touching edge implies that the corresponding nodes can be assigned different colors, but a conflict edge implies that the corresponding nodes must be assigned different colors. To make the conflict graph two-colorable, it can be necessary to remove some touching and conflict edges.

Node splitting 103 and graph update 104. In the CCD approach, DPL layout decomposition is cast as a problem of modifying the conflict graph by decomposing selected layout feature nodes (thus adding new nodes and inducing new edges) so that the graph can be properly two-colored. To this end, the key is the removal of conflict cycles (CCs), which are the odd-length—and hence not two-colorable—cycles of conflict edges in the conflict graph. Node splitting is performed to remove the conflict cycles.

To find all possible dividing points on the layout feature nodes, a node projection process is provided. Specifically, for each node in the graph, compute its projections from adjacent nodes connected with conflict edges. Based on the projections, feasible dividing points can be computed. Two important considerations are (1) not all layout features have feasible dividing points, for which the resulting overlap lengths exceed the required overlap margin, and (2) a given layout feature can have several dividing points at which the feature can be split into several smaller features. When the feasible dividing points are computed, the layout features will be split at those dividing points, and the conflict graph will be updated with the newly generated nodes and edges. The layout fracturing can also be considered to be a form of dividing point selection and node splitting, but one in which projections are not computed and a required overlap margin is not guaranteed. Node splitting removes a conflict cycle while generating line-ends with overlap length greater than the required overlap margin. Node splitting in preferred embodiments can avoid the costly only other method of removing a conflict cycle, which is costly layout change.

Conflict cycle detection 105. Most conflict cycles will be removed by node splitting, such that nodes on the cycle become two-colorable at the cost of more line-ends. However, for some conflict cycles there is no feasible dividing point for any node on the cycle. Such a conflict cycle is detected and reported as an irresolvable conflict cycle (iCC) 107 which must be flagged to the designer for design change. A breadth-first search (BFS) based conflict cycle detection algorithm is used in preferred embodiments to find such conflict cycles in the conflict graph.

ILP-based DPL color assignment 106. After all conflict cycles have been detected and reported, the remaining graph after removing those conflict cycles becomes two-colorable. ILP-based coloring is performed on the conflict cycle-free graph to find an optimal coloring solution, optimizing the weighted combination of the overlap lengths, the number of cuts and design rule violations. Post-processing functions include analysis of the overlap lengths for all pairs of touching features (=adjacent split parts of an original layout feature, which have been assigned different mask colors), and design rule checking in the final mask solution.

FIGS. 2A-2D illustrates layout decomposition and coloring according to the preferred embodiment CCD approach. Polygonal layout features 201 are fractured into rectangles, over which a conflict graph 202 is constructed with conflict edges (dotted) 203 and touching edges (solid) 204. To remove the conflict cycles in the conflict graph, node splitting is carried out along the computed dividing points denoted by the dividing lines 205. After node splitting, the conflict graph is updated with newly generated nodes and updated edges 206. Irresolvable conflict cycles which cannot be removed by the node splitting process are reported and marked (dashed) 207. When irresolvable conflict cycles are detected by conflict cycle detection, their edges are marked and deleted to make the remaining graph two-colorable. Finally, ILP-based coloring is used to obtain a final coloring solution for the two-colorable rectangular features that are mapped by the conflict graph 208, where the weighted cost of the overlap lengths, number of line-ends and design rule violations is minimized. Here, a line 209 in the conflict graph associated with touching edge $e_1$ 210 is deleted as a result of a cut specified in the coloring solution. Irresolvable conflict cycles are reported to the designer. The designer will determine how to perform layout modification on the (problematic) rectangular features.

B. Pure ILP Approach

FIG. 3 shows a preferred embodiment PILP flow for DPL layout decomposition. The flow is similar to CCD flow as in FIG. 1, except (1) there is no conflict cycle detection, and (2) a more sophisticated ILP formulation is used to find a coloring solution with minimized design changes. More precisely, given a layout, the steps of "Layout fracturing" 301, "Graph construction" 302, "Node splitting" 303 and "Graph update" 304 are the same as in the CCD approach, and yield an updated conflict graph on the split layout feature nodes. Although most coloring conflicts (conflict cycles in the CCD approach) are resolved during node splitting, the updated graph is not guaranteed to be two-colorable. In other words, some conflict edges can require deletion (i.e., design changes) for a feasible coloring solution to exist. After computation of the overlap lengths between each pair of touching rectangles 305, and ILP-based color assignment 306 is performed using the conflict graph to find a coloring solution that minimizes a weighted sum of the number of design changes, cuts, design rule violations and overlap lengths.

FIGS. 4A-4D illustrate an example PILP layout decomposition flow. Polygonal layout features 401 are fractured into rectangles, over which the conflict graph 402 is constructed. Conflict edges 403 and touching edges 404 are identified as they are in FIGS. 2A-2D. The method of FIGS. 4A-4D computes projections for all nodes in the conflict graph, according to which feasible dividing points are computed as indicated by the lines 405. Then node splitting is carried out at the feasible dividing points and the conflict graph is updated with newly generated nodes and updated edges 406. Finally, ILP-based color assignment obtains a final coloring solution 407, where conflict edge $e_1$ in 408 in the conflict graph and touching edge $e_2$ 409 in the conflict graph are deleted to make the rectangular features mapped by the graph two-colorable.

DPL Color Assignment Problem

A. Problem Formulation

Fracturing and DPL Color Assignment Problem

Given: Layout L, and maximum distance between two features (i.e., polygons), t, at which the color assignment is constrained.

Find: A fracturing of L and a color assignment of fractured features to minimize total cost.

Subject to: (i) Two non-touching fractured features corresponding to nodes $n_i$ and $n_j$ with $0<d_{i,j}<t$ must be assigned different colors. (ii) Two touching features with $d_{i,j}=0$, if assigned different colors, incur a cost $c_{i,j}$.

When a polygonal feature is split into two parts, the two line-ends at a dividing point (DP) must be sufficiently overlapped in light of manufacturing process tolerances, e.g., overlay and misalignment tolerances. The process in FIGS. 5A-5F illustrate the use of extended features (EF) that address the overlap requirement under the constraints that must still satisfy DPL design rules: the spacing between features at the dividing point must be greater than the minimum coloring spacing. In FIGS. 5A-5C, the assignment of a first dividing point leads to different minimum spacings after layout decomposition than in the alternative assignment in FIGS. 5D-5F, though each resultant layout decomposition is two-colorable. In FIGS. 5A-5C, when extending features for overlay margin, the dividing point 501 causes violation of the minimum coloring spacing, t (502,503). The dividing point 504, on the other hand, maintains the minimum coloring spacing even after line-end extension for overlay margin 505, 506.

B. Fracturing and Conflict Graph Construction

Given a layout L, a rectangular layout $L_R$ is obtained by fracturing layout polygons into rectangles. The layout polygons are fractured into rectangles so that distance computation and other feature operations (e.g., feature splitting) become easier. A minimum-sliver fracturing algorithm is preferred to fracture the polygonal layout features into a set of non-overlapping rectangles. The minimum-sliver fracturing algorithm minimizes the number of small rectangles and thereby helps avoid minimum design rule violations.

Figure 6A:
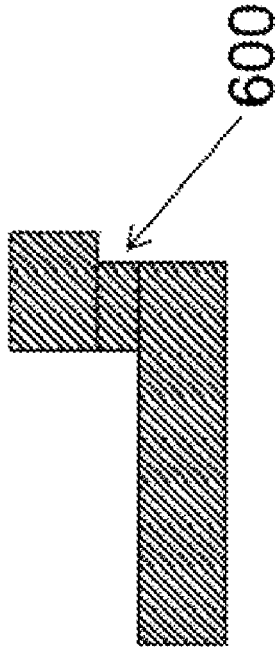
FIGS. 6A-6D illustrate a preferred layout fracturing process that applies minimum-sliver fracturing (FIG. 6D) compared to horizontal (FIG. 6B) and vertical (FIG. 6C) fracturing for an example polygonal layout feature (FIG. 6A)
Figure 6B:
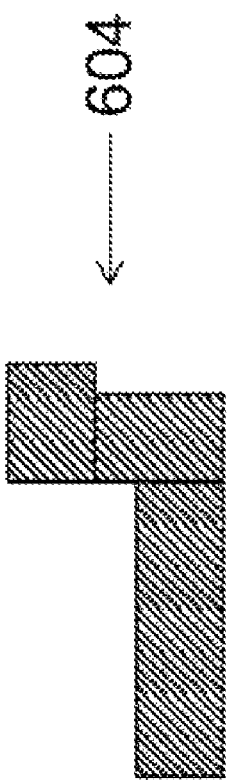
Figure 6C:
Figure 6D:

FIGS. 6A-6D show an example of minimum-sliver fracturing process in FIG. 6D compared to horizontal and vertical fracturing. A polygonal layout feature 601 of FIG. 6A is fractured in horizontal direction in FIG. 6B, in a vertical direction in FIG. 6C, and using minimum-sliver fracturing in FIG. 6D. Both horizontal and vertical fracturing methods generate a sliver 600. Such a sliver 600, when its adjacent touching features are assigned different colors, can violate a minimum design rule even after line-end extension for overlay margin. Though ILP-based coloring helps avoid such minimum design rule violations, it would be helpful to avoid as many slivers as possible at the beginning.

Figure 7:
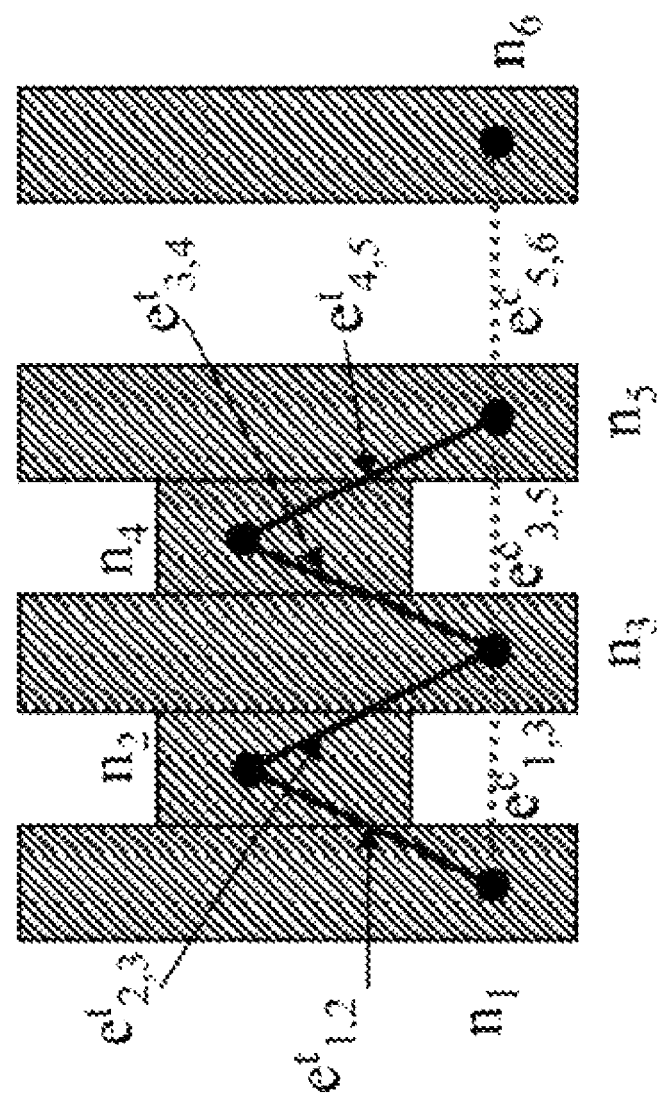
FIG. 7 illustrates a preferred process for conflict graph generation

FIG. 7 shows illustrates a process for conflict graph generation. Layout decomposition begins with construction of a conflict graph based on a polygonal feature layout that has been fractured into rectangular features. Given a (post-fracturing) rectangular layout $L_R$, a conflict graph $G=(V, E^C \cup E^T)$ is constructed by: (1) representing each feature (i.e., rectangle) by a node n "●"; (2) for any two non-touching features within distance t, connecting the two corresponding nodes with a conflict edge $e^c$; and (3) for any two touching features, connecting the two corresponding nodes with a touching edge $e^t$. A further condition for (2) is that two non-touching features connected by a conflict edge in the graph must either belong to different polygonal layout features, or belong to the same polygonal layout feature with no other touching feature between them (i.e., no touching features entirely block the two non-touching features). In FIG. 7, $E^C=\{e^c_{1,3}, e^c_{3,5}, e^c_{5,6}\}$ are conflict edges and $E^T=\{e^t_{1,2}, e^t_{2,3}, e^t_{2,4}, e^t_{4,5}\}$ are touching edges. There is no conflict edge between $n_2$ and $n_4$ since the rectangular is feature associated with node $n_3$ blocks these two nodes.

C. Node Splitting

Node splitting is applied to layout feature nodes in both the CCD and PILP approaches to resolve as many coloring conflicts (i.e., conflict cycles in the CCD approach) as possible subject to the given overlap margin requirement. The objective is to obtain a two-colorable graph. Even though the graph may not be two-colorable after node splitting due to certain layout patterns having no feasible dividing points, any coloring conflicts resolved by node splitting will avoid costly layout changes. To describe our node splitting technique, we define node projection as follows.

Definition 1: The node projection $P_{i,j}$ from node $n_i$ to node $n_j$ is a set of points on $n_j$ that have distance to node $n_i$ less than minimum coloring spacing t.

FIGS. 8A and 8B shows two example node projections 801,802 from node $n_i$ to $n_j$. Node projections can also have complicated shapes including circular sectors, rectangles, etc.; the examples in FIGS. 8A and 8B shows only the projections on the surface of node $n_j$. In the example implementation, the projections are approximated as rectangles to reduce the computational complexity.

Fact 1: In the conflict graph, node projections between each pair of nodes connected with a conflict edge are non-empty.

Definition 2: A horizontal (vertical) merged projection $m_h(P)$ ($m_v(P)$) for a given projection P on node n is the union of P and all the projections on n that overlap with P in horizontal (vertical) direction.

Definition 3: Node projections are separable if they are disjoint.

Definition 4: The overlap length between two touching nodes is the maximum length that the two nodes can be overlapped by extending them in opposite directions toward each other without introducing new edges in the conflict graph.

In the conflict graph, wherever there is a pair of touching nodes, there is a dividing point, i.e., the touching nodes were generated by splitting the original feature at the dividing point. We now discuss our node splitting method.

Rule-based node splitting: Given a node $n_i \in G$, if (i) the horizontal (resp. vertical) merged projections $m_h(P_{j,i})$ (resp. $m_v(P_{j,i})$) and $m_h(P_{k,i})$ (resp. $m_v(P_{k,i})$) corresponding to adjacent nodes $n_j$ and $n_k$ are separable, (ii) the resulting overlap length of the horizontal (resp. vertical) splitting is not less than the given overlap margin, and (iii) there are no design rule violations after splitting, then node ni can be horizontally (resp. vertically) split into two nodes between the merged projections. The dividing point can be chosen anywhere in between the merged projections such that no merged projections are cut, and no violations of the required overlap margin or design rules occur.

According to Definition 4, overlap length is not affected by the position of the dividing point in the overlap area. Preferred embodiments set the dividing point at the center of the overlap area such that each touching node can be extended by half of the overlap length. Design rule checking considers the extended layout features on each exposure mask rather than the features immediately after node splitting. While the size of a node after splitting may violate a minimum design rule, the node size after extension for overlay margin may be acceptable. During node splitting and design rule checking the sizes of extended nodes is computed based on the projections and overlap length, which is more accurate and appropriate with the double patterning technique.

FIG. 9 shows an example of rule-based node splitting, where the horizontal merged projections $m_h(P_{j,i})=P_{j,i} \cup P_{l,i}$ and $m_h(P_{k,i})=P_{k,i}$ on node $n_i$ corresponding to nodes $n_j$ and $n_k$ are separable with the overlap length not less than the given overlap margin. Hence, node $n_i$ can be split into two new nodes $n_p$ and $n_q$ at the dividing point 901, with the corresponding overlap length $o_{p,q}$. The dividing point is set at the center between the lower point of $P_{l,i}$ 902 and the upper point of $P_{k,i}$ 903.

Node splitting is applied to all the nodes with feasible dividing points in the conflict graph, which eventually provides a graph that becomes two-colorable after removing the minimum number of conflict edges or reporting the minimum number coloring conflicts (i.e., the conflict cycles). The rule-based node splitting is performed for each node with feasible dividing points. To compute the feasible dividing points, projections are calculated for each node from its adjacent nodes connected with conflict edges in the conflict graph. According to the projections of a given node, the overlap length for each possible dividing point is computed. For each dividing point with achievable overlap length greater than the required overlap margin, node splitting is used to split the node into two nodes at the dividing point. After node splitting at all feasible dividing points, the conflict graph is updated.

D. Conflict Cycle Detection

After node splitting, there may still be coloring conflicts in the updated conflict graph due to some special layout pattern configurations. To detect such coloring conflicts, the conflict cycle detection (CCD) approach finds odd-length cycles of conflict edges in the conflict graph. In the following part of this subsection, unless otherwise specified, all cycles and paths are for conflict edges rather than touching edges.

Definition 5: Given a conflict graph G, a conflict cycle is an odd-length (odd number of conflict edges) cycle in G.

Definition 6: A conflict cycle C in conflict graph G is a minimal conflict cycle if for any two nodes u,v∈C, there is no path between u and v of odd length (number of conflict edges) less than that of the odd-length path $P_{u,v}$ in C and no path between u and v of even length less than that of the even-length path $P'_{u,v}$ in C.

Definition 7: Given a conflict graph G, a BFS-induced graph of node n is a subgraph of G, which has been visited by the BFS search from node n when the first conflict cycle is detected.

Definition 8: A minimal conflict cycle of node n is a minimal conflict cycle in the BFS-induced graph of node n.

Given a connected conflict graph, conflict cycles are detected from a starting node $n_0$ using Algorithm 1 (FIG. 10) with flag for cycle reporting set to be false. From Lines 9-15 in Algorithm 1, the algorithms are called in the following order: (1) Algorithm 1 (flag=false), (2) Algorithm 1 (flag=true), and (3) Algorithm 2 (FIG. 11). Time complexity of the conflict cycle detection algorithm is O(V+E), where V and E are respectively the number of nodes and edges in the conflict graph G.

When a conflict cycle is detected, it is reported for removal by design change (e.g., by increasing the spacing between feature nodes in the cycle, so as to remove one or more conflict edges) since node splitting has already been performed. Conflict cycle detection and reporting is carried out in an iterative manner: after each conflict cycle is detected, conflict cycle reporting is invoked to mark the conflict cycle and remove it from the conflict graph by deleting all the conflict edges in the cycle. Further rounds of detection and reporting are performed until no conflict cycles exist in the graph, i.e., the graph is two-colorable.

E. Irresolvable Conflict Cycle (iCC)

DPL layout decomposition fails when layout features within the coloring spacing lower bound cannot be assigned different colors. Such a failure, referred to as an irresolvable conflict cycle (iCC), consists of two cases: (a) among all the feature nodes there is no dividing point with nonzero overlap length to remove the conflict cycle, and (b) even if there is a possible dividing point to remove the conflict cycle, the overlap length is less than the required overlap margin. Removal of the conflict cycle can be achieved by design change, e.g., by increasing the spacing between two neighboring features to be greater than t. In the CCD approach, after conflict cycle detection and reporting, ILP-based coloring is applied to decide which nodes to split in the final decomposition result. The ILP optimizes a weighted objective of number of cuts, design rule violations, and overlap lengths. In the PILP approach, the conflict graph may not be two-colorable after the node splitting. A more sophisticated ILP-based coloring method is applied to compute a minimized number of conflict edges for deletion. The deleted conflict edges will be reported and marked for design changes. To reduce the cost of the design change, conflict edges between features of different cell instances are preferentially deleted, so that the desired design changes can be obtained by shifting the cell instances. Besides minimizing the number of design changes, the ILP also determines which nodes to split (i.e., the corresponding pair of touching nodes are assigned different colors) in the final decomposed layout to optimize a weighted objective of number of cuts, design rule violations, and overlap lengths.

F. Layout Partitioning

In most placements, the conflict graph between cells is sparse: due to the required poly-to-cell boundary distance, as well as whitespace between cells, there are not many edges between the cells. As a result, many "islands" (connected components) can be found in the conflict graph. At the same time, runtimes of the ILP-based coloring algorithms increase dramatically when the number of nodes and edges in the graph is large. Therefore, the method preferably merges the nodes into small clusters according to the connectivity information, with no edges or nodes of a given polygon occurring in multiple clusters. Each cluster has its separate conflict graph, and ILP-based coloring can be performed on each cluster in sequence. Because there are no edges between clusters, and no polygon has nodes in more than one cluster, the final solution is simply the union of solutions for all the clusters, with no degradation of solution quality. The preferred layout partitioning algorithm is given in Algorithm 3 (FIG. 12).

For dense graphs which can be induced by a large minimum coloring spacing t, cluster sizes after layout partitioning may still be large. Graph partitioning methods, such as those disclosed in A. E. Caldwell, A. B. Kahng and I. L. Markov, "Improved Algorithms for Hypergraph Bipartitioning", *Proc. Asia and South Pacific Design Automation Conference*, 2000, pp. 661-666, can be adopted to partition large clusters into smaller ones to further reduce the runtime of ILP-based coloring, but this is at the cost of introducing sub-optimality into the coloring solutions. Preferred embodiments preferentially delete touching edges to partition the clusters to avoid incurring unnecessary design changes. Furthermore, to avoid violating the required overlap margin, only when the overlap length between the corresponding touching nodes is greater than the overlap margin can a touching edge be deleted.

G. Min-Cost Color Assignment Problem Formulation

Min-Cost. Color Assignment Problem

Given: A list of rectangles R that is color assignable, and maximum distance between two features, t, at which the color assignment is constrained.

Find: Color assignment of rectangles to minimize total cost.

Subject to: For any two non-touching rectangles with $0<d_{i,j}<t$, assign different colors. For any two touching rectangles with $d_{i,j}=0$, assigning $n_i$ and $n_j$ different colors incurs cost $c_{i,j}$.

(1) Conflict Cycle Detection (CCD) Approach: Min-cost color assignment is formulated as the following ILP:

Minimize: $\Sigma c_{i,j} \times y_{i,j}$

Subject to:

$$x_i + x_j = 1 \; \forall e_{i,j}^c \tag{1}$$

$$x_i - x_j \leq y_{i,j} \; \forall e_{i,j}^t \tag{2}$$

$$x_j - x_i \leq y_{i,j} \; \forall e_{i,j}^t \tag{3}$$

where $x_i$ and $x_j$ are binary variables (0/1) for the colors of rectangles $r_i$ and $r_j$, and $y_{i,j}$ is a binary variable for touching edge $e_{i,j}^t \in E^T$, i.e., for any pair of touching rectangles $r_i$ and $r_j$. Constraint (1) specifies that non-touching rectangles $r_i$ and $r_j$ within distance t should be assigned different colors. Constraints (2) and (3) are used for evaluating the cost when touching rectangles $r_i$ and $r_j$ are assigned different colors. The cost for touching rectangles is defined as $$c_{i,j} = \alpha \cdot f(w_{i,j})/(f(l_i) \cdot f(l_j)) + \beta + \gamma/o_{i,j} \tag{4}$$

where $w_{i,j}$ is the width of the rectangle edge between rectangles $r_i$ and $r_j$, $l_i$ and $l_j$ are the lengths of the rectangle edges of $r_i$ and $r_j$ which are opposite to the touching edge between $r_i$ and $r_j$, $o_{i,j}$ ($=o_{j,i}$) is the overlap length between nodes $n_i$ and $n_j$, and $\alpha$, $\beta$, and $\gamma$ are user-defined parameters to weight the different optimization objectives. Function $f$ is defined as $$f(x) = \begin{cases} FS_{min} & \forall\, x \geq FS_{min} \\ x & \forall\, x < FS_{min} \end{cases} \qquad (5)$$

where $FS_{min}$ is minimum feature size, i.e., the threshold on the features, below which a design rule violation will occur. The ILP problem formulation seeks to minimize the weighted cost over the design rule violations, the number of cuts on the layout polygons, and the overlap lengths between touching features of different colors.

Minimizing design rule violations: During layout fracturing, small rectangles can be generated due to certain polygonal layout features. According to Equation (4), higher costs will be assigned to smaller-size pairs of touching rectangles. Thus, the ILP aims to minimize design rule violations in the final layout.

Minimizing the number of cuts: The cuts on the layout features will introduce more line-ends, which is undesirable due to line-end shortening effects and overlay errors. In Equation (4), setting the second term ($\beta$) to be greater than the first term, gives cut minimization higher priority relative to design rule violations.

Maximizing the overlap length: Maximum overlap length satisfying the required overlap margin is also desirable. In Equation (4), a larger $\gamma$ value corresponds to more emphasis on overlap length maximization.

(2) Pure ILP (PILP) Approach: Min-cost color assignment is formulated using a different ILP. In addition to the variables $x_i$ and $y_{i,j}$, the approach introduces a new binary variable $z_{i,j}$ for conflict edge $e^c_{i,j} \in E^C$. $z_{i,j}=0$ when $x_i \neq x_j$, while $z_{i,j}=1$ when $x_i = x_j$. With the new variable:

Minimize: $\Sigma y_{i,j} \cdot (\beta + \gamma/o_{i,j}) + \Sigma \lambda \cdot z_{i,j}$ Subject to:

$$\begin{cases} 2x_i - x_j - x_k \leq 1 \\ 2x_i - x_j - x_k \leq 1 \end{cases} \forall\, e^t_{i,j}, e^t_{i,k} \text{ and } l_i < FS_{min} \qquad (6)$$

$$x_i = x_j \quad \forall\, e^t_{i,j} \text{ and } l_i < FS_{min} \qquad (7)$$

$$x_i = x_j \quad \forall\, e^t_{i,j} \text{ and } o_{i,j} < OM \qquad (8)$$

$$\begin{cases} x_i - x_j \leq y_{i,j} \\ x_j - x_i \leq y_{i,j} \end{cases} \forall\, e^t_{i,j} \text{ and } o_{i,j} \geq OM \qquad (9)$$

$$\begin{cases} x_i + x_j - 1 \leq z_{i,j} \\ 1 - x_i - x_j \leq z_{i,j} \end{cases} \forall\, e^c_{i,j} \qquad (10)$$

where $l_i$, $FS_{min}$, $o_{i,j}$ are defined as above, and OM is the required overlap margin.

Constraints (6) and (7) avoid design rule violations. In Constraint (6), if the size of rectangle $r_i$ is less than the minimum feature size and $r_i$ touches rectangles $r_j$ and $r_k$ on two sides, then $r_i$ should be assigned the same color as one or both of $r_j$ and $r_k$. In Constraint (7), if the size of rectangle $r_i$ is less than the minimum feature size and $r_i$ only touches rectangle $r_j$, then $r_i$ should be assigned the same color as $r_j$ to avoid a design rule violation.

Constraint (8) enforces the required overlap margin: if the overlap length between touching rectangles $r_i$ and $r_j$ is less than the required overlap margin, then $r_i$ and $r_j$ should be assigned the same color. Constraint (9) is related to the objective of maximizing the final overlap length. When the overlap length $o_{i,j}$ between a pair of touching rectangles $r_i$ and $r_j$ is greater than the required overlap margin OM, a cost $\gamma/o_{i,j}$ is incurred when $r_i$ and $r_j$ are assigned different colors ($x_i \neq x_j$), i.e., $y_{i,j}=1$.

Constraint (10) is related to the objective of minimizing the number of design changes, i.e., the conflict edge removal process that removes the conflict edges between rectangles by changing the design. A cost $\lambda$ is incurred for a conflict edge $e^c_{i,j}$ if $r_i$ and $r_j$ are assigned the same color ($x_i = x_j$), i.e., $z_{i,j}=1$. $\beta$, $\gamma$ and $\lambda$ are user-specified parameters for balancing the different objectives, e.g., a larger $\beta$ corresponds to more emphasis on the minimization of the number of line-ends, a larger $\gamma$ relates to more improvement of overlap length, and a larger $\lambda$ indicates that the number of design changes should be minimized.

(3) Phase Conflict Detection and Node-Deletion Bipartization (PCD and NDB) Coloring Approach: PCD and NDB are suitable methods for the color solution, in other embodiments.

To conduct phase conflict detection a gadget based approach is employed to produce an optimal edge-deletion bipartization solution for a planar conflict graph. The algorithm consists of two main steps, as follows.

Planar graph embedding. The phase conflict graph G is not necessarily an embedded planar graph, which is required by the optimal algorithm, Hence, G is converted to an embedded planar graph G' by removing minimum weight conflict edges that cross other edges. These conflict edges are added to a potential set of conflicts P.

Optimal conflict removal for planar graph. An optimal minimum-weight conflict cycle removal algorithm, Bipartize, is applied to G' for choosing the minimum set of conflicts that, when corrected, will produce a phase-assignable layout, i.e., a two-colorable layout. The list of edges deleted by the algorithm is added to D, a minimal set of conflicts whose removal ensures that G' is two-colorable.

The conflict edges in the conflict graph correspond to feature edges and the touching edges correspond to conflict edges in the conflict cycle graph in the gadget based approach. Cost $\gamma$ is assigned to each conflict edge to ensure that a minimum number of conflict edges will be deleted. For a touching edge between touching features, a cost is assigned considering two factors: the design rule violation, and the overlap length of the two features. When the size of the feature violates the design rule or the overlap length is less than the required overlap margin, a cost of $2\gamma$ is assigned to the touching edge. Otherwise, the cost on the touching edge is assigned as $\alpha + \beta/OL_{i,j}$ where $OL_{i,j}$ is the possible overlap length between $r_i$ and $r_j$. The values of the parameters $\alpha$, $\beta$ and $\gamma$ are set as in the PILP approach discussed above. The phase conflict detection process outputs the deletions of conflict edges and touching edges that make the conflict graph two-colorable. A deleted conflict edge corresponds to a design change, whereas a deleted touching edge corresponds to a cutting on the layout feature, i.e., the two corresponding touching features generated by the layout fracturing or node splitting process will be assigned different colors.

For node-deletion bipartization, a conflict cycle graph is constructed as follows: (1) for each conflict edge $e_{i,k}$, and $e_{k,j}$ where $e_{i,k}$ is a feature edge and $e_{k,j}$ is a conflict edge, and (2) for each touching edge $e_{i,j}$, create a new node $n_k$ to substitute edge $e_{i,j}$ with two new edges $e_{i,k}$ and $e_{k,j}$, where both $e_{i,k}$ and $e_{k,j}$ are feature edges. In the resulting conflict cycle graph, only the newly inserted nodes are deletable during the node deletion bipartization process, and the original nodes are fixed. The weights of the newly inserted node are set to be the same as those of the original conflict edges and touching edges, which are computed in the same way as in the phase conflict detection based method discussed above. After the conflict cycle graph is constructed, the node-deletion bipartization method is executed; it outputs deleted nodes to generate a two-colorable graph, where the nodes can be mapped back to conflict edges and touching edges in the original conflict graph. As with the phase conflict detection based method, a deleted conflict edge corresponds to a design change, while a deleted touching edge corresponds to cutting of a layout feature.

FIG. 13A shows a conflict graph after node splitting as in FIG. 4C, which is based upon the polygonal layout of FIG. 4A. FIG. 13B shows the resulting conflict graph from the phase conflict detection. In FIG. 13A, the conflict graph with conflict edges (dotted lines) and touching edges (solid is converted into a conflict graph with feature edges (dash) and conflict edges (thick solid lines) to conduct phase conflict detection FIG. 13C includes new nodes (shown as empty circles), feature edges (dash), and conflict edges (thick solid lines) for NDB. In FIG. 13B, the cycles with odd number of feature edges, need to be broken for graph bipartization where possible solutions are the deletion of edges $e_1$ and $e_2$. In FIG. 13C, nodes $n_1$ and $n_2$ need to be broken. Therefore, to make the conflict graph in 13A two-colorable, the corresponding edges $e_1$ and $e_2$ in need to be deleted to break all the conflict cycles. After deleted conflict and touching edges are computed in our conflict graph using either the PCD or NDB based method, a heuristic breadth first search (BFS) based node coloring is performed on the two-colorable graph, and the number of deleted conflict edges, the number of cuts on features, and statistics (i.e., minimum, mean and standard deviation) of the final overlap lengths are extracted from the coloring solution.

Artisans will recognize that the preferred embodiments discussed above and in the attachments that follow the example claim provide a number of advantages. Embodiments of the invention provide layout decomposition methods that can be implemented in software and systems and provided to lithography systems for double patterning lithography by layout fracturing, graph construction, node splitting, conflict cycle detection, and integer linear programming based color assignment, to improve a weighted combination of DPL objectives, including overlap lengths, design rule violations, and number of cuts.

Embodiments of the invention provide layout decomposition methods that can be implemented in software and systems and provided to lithography systems layout decomposition for double patterning lithography by layout fracturing, graph construction, node splitting, overlap length computation, and integer linear programming based color assignment, to improve a weighted combination of DPL objectives, including number of design changes, overlap lengths, and number of cuts, subject to constraints on design rule violations.

Embodiments of the invention provide layout decomposition methods that can be implemented in software and systems and provided to lithography systems and that incorporate a minimum-sliver fracturing algorithm, which minimizes the number of slivers or small rectangles.

Embodiments of the invention provide layout decomposition methods that can be implemented in software and systems and provided to lithography systems and where the conflict graph is constructed over the fractured rectangles. Preferred embodiment node splitting incorporates the computation of node projections for each node in the conflict graph. In preferred embodiments, coloring conflicts between nodes are detected using a conflict detection algorithm. In preferred embodiments, integer linear programming is used to obtain the color assignment for the layout features on a two-colorable conflict graph. In preferred embodiments, at least one objective is to maximize the overlap lengths between pairs of touching rectangles. In preferred embodiments, at least one objective is to minimize the number of cuts between touching rectangles assigned to different colors. In preferred embodiments, at least one objective is to minimize the number of design rule violations in the final coloring solution. In preferred embodiments, the overlap lengths between pairs of touching rectangles are computed before integer linear programming based color assignment. In preferred embodiments, integer linear programming is used to obtain the color assignment for the layout features on a conflict graph which may not be two-colorable. In preferred embodiments, at least one objective is to minimize the number of design changes, which correspond to the deleted conflict edges. In preferred embodiments, at least one objective is to maximize the overlap lengths between pairs of touching rectangles. In preferred embodiments, at least one objective is to minimize the number of cuts between touching rectangles assigned to different colors. In preferred embodiments, at least one constraint is for avoiding design rule violations in the final coloring solution. In preferred embodiments, the conflict graph incorporates both conflict edges and touching edges. In preferred embodiments, node projections for a node are computed from its adjacent nodes connected with conflict edges and within minimum coloring spacing. In preferred embodiments, a conflict edge indicates the corresponding nodes must be assigned different colors. In preferred embodiments, a touching edge indicates the corresponding nodes can be assigned different colors, which results in a cut.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A layout decomposition method to produce exposure layouts for double patterning lithography from an initial layout, the method comprising steps of:
   accepting an initial double patterning lithography polygonal layout;
   fracturing features in the polygonal layout into rectangular layout set of non-overlapping rectangular features;
   constructing a conflict graph over the rectangular features, wherein edges between nodes in the conflict graph identify rectangular features having conflicting edges that are less than predetermined minimum coloring spacing distance and rectangular features having touching edges;
   conducting node splitting to split rectangular features identified as conflicting according to the conflict graph while extending split rectangles to create an overlay margin between split rectangular features;
   updating the conflict graph to generate new nodes,
   identifying irresolvable conflict cycles in the updated conflict graph and deleting edges in the conflict graph associated with the irresolvable conflict cycles;
   conducting, by using a computer, coloring of the rectangular features to obtain a two-colorable solution for rectangles identified in the updated conflict graph, where a weighted cost of the overlap lengths, number of line-ends and design rule violations is minimized.

2. The layout decomposition method of claim 1, wherein said coloring comprises conducting integer language programming-based coloring by:
performing a first procedure to detect conflict cycles in the updated conflict graph that are irresolvable for double patterning lithography coloring, and determining a coloring solution for the remaining nodes using integer linear programming (ILP);
performing a second procedure, based on a different ILP problem formulation, to delete some edges in the conflict graph to make it two-colorable, and then to find the coloring solution in the new conflict graph to produce exposure layouts.

3. The layout decomposition method of claim 1, wherein said fracturing is conducted according to a minimum-sliver fracturing algorithm.

4. The layout decomposition method of claim 3, wherein said fracturing minimizes horizontal and vertical slivers.

5. The layout decomposition method of claim 1, wherein said constructing comprises:
for a rectangular layout set $L_R$, constructing a conflict graph $G=(V, E^C \cup E^T)$ where $E^C$, $E^T$ are sets of conflict edges and touching edges, respectively and V is set of nodes in the layout set $L_R$ by:
(1) representing each rectangular feature by a node in the set of V;
(2) for any two non-touching rectangular features less than the minimum color spacing distance t, connecting the two corresponding nodes with a conflict edge $e^c$ in set of conflict edges $E^C$;
(3) for any two touching rectangular features, connecting the two corresponding nodes with a touching edge e' in the set of touching edges $E^T$.

6. The layout decomposition method of claim 5, wherein said connecting with a conflict edge $e^c$ connects conflicting non-touching rectangular features such that two non-touching features connected by a conflict edge $e^c$ either belong to different polygonal layout features, or belong to a common polygonal layout feature and have no other touching feature between them whereby no touching features entirely block two non-touching features.

7. The layout decomposition method of claim 1, wherein said node-splitting comprises:
given a node $n_i$, if (i) merged projections corresponding to adjacent nodes $n_j$ and $n_k$ are separable, (ii) a resulting overlap length of splitting is not less than a predetermined overlap margin, and (iii) there are no design rule violations after splitting, then node $n_i$ can be split in said node splitting into two nodes between the merged projections; wherein a dividing point is assigned anywhere between the merged projections such that no merged projections are cut, and no violations of minimum overlap margin or violation of design rules occur.

8. The layout decomposition method of claim 7, wherein:
a respective horizontal or vertical merged projection $m_h(P)$, $(m_v(P))$ for a given projection P on node n is the union of P and all the projections on n that overlap with P in respective horizontal or vertical direction;
node projections are separable if they are disjoint;
an overlap length between two touching nodes is a maximum length that the two nodes can be overlapped by extending them in opposite directions toward each other without introducing new edges in the conflict graph.

9. The layout decomposition method of claim 8, wherein the dividing point is set the dividing point at the center of an overlap area such that each touching node can be extended by half of the overlap length.

10. The layout decomposition method of claim 9, comprising checking extended rectangular layout features for design rule violations on each exposure mask and not immediately after setting the dividing point for node splitting.

11. The layout decomposition method of claim 1, wherein said identifying comprises finding conflict cycles having an odd number of conflict edges.

12. The layout decomposition method of claim 1, wherein said fracturing is conducted according to a minimum-sliver fracturing algorithm.

13. The layout decomposition method of claim 1, further comprising providing the coloring solution to an optical lithography system and performing optical lithography.

14. The layout decomposition method of claim 1, further comprising a pre-processing step that fractures polygonal layout features in the lithography layout into rectangles according to vertex coordinates of neighboring features.

15. The layout decomposition method of claim 1, said node splitting and updating resolve coloring conflicts and enlarge the solution space for double patterning lithography coloring; and then said conducting optimizes the coloring solution with a process-aware cost function that avoids small jogging line-ends, maximizes overlap at dividing points of polygons.

16. The layout decomposition method of claim 15, wherein the cost function makes preferential splits at landing pads, junctions and long runs.

17. The layout decomposition method of claim 1 applied in a double patterning layout design system to modify a mask design layout to be used to conduct lithography, the tool being executed by a computer system and including code for conducting the method steps.

18. The layout decomposition method of claim 1, wherein said conducting conducts coloring according to:
Minimize: $\Sigma c_{i,j} \times y_{i,j}$
Subject to:

$$x_i + x_j = 1 \; \forall e_{i,j}^c \qquad (1)$$

$$x_i - x_j \leq y_{i,j} \; \forall e_{i,j}^t \qquad (2)$$

$$x_j - x_i \leq y_{i,j} \; \forall e_{i,j}^t \qquad (3)$$

wherein $x_i$ and $x_j$ are binary variables (0/1) for the colors of rectangles $r_i$ and $r_j$, and $y_{i,j}$ is a binary variable for a touching edges $e_{i,j}^t \in E^T$, i.e., representing each pair of touching rectangular features $r_i$ and $r_j$ and E quations (1)~(3) define constraints, wherein constraint (1) specifies that non-touching rectangles $r_i$ and $r_j$ within distance t should be assigned different colors and constraints (2) and (3) are used together for evaluating the cost when touching rectangles $r_i$ and $r_j$ are assigned colors.

19. The layout decomposition method of claim 18, wherein equations (2) and (3) listed in claim 18 are used to evaluate cost when touching rectangular features $r_i$ and $r_j$ are assigned the same or different colors, and the cost is defined as:

$$c_{i,j} = \alpha \cdot f(w_{i,j})/(f(l_i) \cdot f(l_j)) + + \beta + \gamma/o_{i,j} \qquad (4)$$

where $w_{i,j}$ is the width of a rectangle edge between rectangles $r_i$ and $r_j$, $l_i$ and $l_j$ are the lengths of the rectangle edges of $r_i$ and $r_j$ which are opposite to the touching edge between $r_i$ and $r_j$, $o_{i,j}(=o_{j,i})$ is the overlap length between nodes $n_i$ and $n_j$, and $\alpha$, $\beta$, and $\gamma$ are user-defined parameters to weight different optimization objectives, and function $f$ is defined as $$f(x) = \begin{cases} FS_{min} & \forall\, x \geq FS_{min} \\ x & \forall\, x < FS_{min} \end{cases} \quad (5)$$

wherein $FS_{min}$ is minimum feature size below which a design rule violation will occur.

20. The layout decomposition method of claim 1, wherein said constructing and node splitting maximize overlap lengths between pairs of touching rectangles.

21. The layout decomposition method of claim 1, wherein said constructing and node splitting minimize the number of cuts between touching rectangles assigned to different colors.

22. The layout decomposition method of claim 1, wherein said conducting conducts coloring according to a phase conflict detection that assigns a cost to conflict edges in the conflict graph to ensure that a minimum number of conflict edges will be deleted.

23. The layout decomposition method of claim 22, wherein a cost is assigned to touching edges in view of design rule violations and/or minimum required overlap lengths.

24. The layout decomposition method of claim 1, wherein said conducting conducts coloring according to a node deletion bipartization, wherein new nodes are created to establish new feature edges as a substitute for touching edges and node deletion bipartization is conducted in which only new nodes can be deleted to obtain the coloring solution.

* * * * *

UNITED STATES PATENT AND TRADEMARK OFFICE
CERTIFICATE OF CORRECTION

PATENT NO. : 8,402,396 B2
APPLICATION NO. : 12/892371
DATED : March 19, 2013
INVENTOR(S) : Kahng et al.

It is certified that error appears in the above-identified patent and that said Letters Patent is hereby corrected as shown below:

On the Title Page:

Item (56) References Cited
Other Publications:
Page 1, right column, line 10      Delete "652109-1-852109-15" and insert --652109-1-652109-15-- therefor.

Item (57) Abstract:
Line 8      Delete "goals" and insert --goal-- therefor.

In the Specification:

| | |
|---|---|
| Col. 2, line 21 | Before "leads to" delete "is". |
| Col. 2, line 52 | Before "Alternate" delete "to". |
| Col. 4, line 55 | Before "comprises" delete "can". |
| Col. 5, line 59 | Delete "features" and insert --feature-- therefor. |
| Col. 7, line 41 | Delete "illustrates" and insert --illustrate-- therefor. |
| Col. 9, line 17 | Delete "shows". |
| Col. 9, line 33 | Delete "$e^{t}_{2,4}$" and insert --$e^{t}_{3,4}$-- therefor. |
| Col. 9, line 51 | Delete "shows" and insert --show-- therefor. |
| Col. 10, line 14 | Delete "ni" and insert --$n_i$-- therefor. |
| Col. 11, line 18 | Delete "flag=true" and insert --f lag=true-- therefor. |
| Col. 13, line 39 | Delete "$2x_i - x_j - x_k \leq 1$" and insert --$x_j + x_k - 2x_i \leq 1$-- therefor. |
| Col. 14, line 19 | Delete the "." between "conflict" and "detection". |
| Col. 14, line 35 | Delete the "." between "that" and "G'". |

Signed and Sealed this
Third Day of September, 2013

Teresa Stanek Rea
*Acting Director of the United States Patent and Trademark Office*

CERTIFICATE OF CORRECTION (continued)
U.S. Pat. No. 8,402,396 B2

In the Claims:

Col. 17, line 65         Between "set" and "at the center" delete "the dividing point".
Claim 9

Col. 18, line 47         After "touching" delete "edges" and insert --edge-- therefor.
Claim 18

Col. 18, line 48         Delete "E quations" and insert --Equations-- therefor.
Claim 18